(12) United States Patent
Bettesh

(10) Patent No.: US 7,778,356 B2
(45) Date of Patent: Aug. 17, 2010

(54) MODULATOR AND METHOD FOR PRODUCING A MODULATED SIGNAL

(75) Inventor: Ido Bettesh, Haifa (IL)

(73) Assignee: Given Imaging Ltd., Yoqneam (IL)

( * ) Notice: Subject to any disclaimer, the term of this patent is extended or adjusted under 35 U.S.C. 154(b) by 752 days.

(21) Appl. No.: 11/450,513

(22) Filed: Jun. 12, 2006

(65) Prior Publication Data

US 2006/0280258 A1    Dec. 14, 2006

Related U.S. Application Data

(60) Provisional application No. 60/690,138, filed on Jun. 14, 2005.

(51) Int. Cl.
*H04L 27/20* (2006.01)
(52) U.S. Cl. .................. 375/308; 375/302; 375/295; 375/242; 375/259; 375/353; 331/175; 331/182; 331/183
(58) Field of Classification Search .......... 375/308, 375/302, 295, 242, 259, 353; 331/175, 182, 331/183, 177
See application file for complete search history.

(56) References Cited

U.S. PATENT DOCUMENTS

| | | | |
|---|---|---|---|
| 3,322,374 A | 5/1967 | King | |
| 3,683,389 A | 8/1972 | Hollis | |
| 3,971,362 A | 7/1976 | Pope et al. | |
| 3,984,628 A | 10/1976 | Sharp | |
| 4,246,792 A | 1/1981 | Matzuk | |
| 4,273,431 A | 6/1981 | Farmer et al. | |
| 4,278,077 A | 7/1981 | Mizumoto | |
| 4,416,283 A | 11/1983 | Slocum | |
| 4,428,005 A | 1/1984 | Kubo | |
| 4,431,005 A | 2/1984 | Mc'cormick | |
| 4,532,918 A | 8/1985 | Wheeler | |
| 4,539,603 A | 9/1985 | Takeuchi et al. | |
| 4,646,724 A | 3/1987 | Sato et al. | |
| 4,689,621 A | 8/1987 | Kleinberg | |
| 4,741,327 A | 5/1988 | Yabe | |
| 4,786,982 A | 11/1988 | Wakahara et al. | |
| 4,841,291 A | 6/1989 | Swix et al. | |
| 4,844,076 A | 7/1989 | Lesho et al. | |

(Continued)

FOREIGN PATENT DOCUMENTS

DE    34 40 177    5/1986

(Continued)

OTHER PUBLICATIONS

European Search Report for Application No. EP 06 11 5293 mailed on Nov. 17, 2008.

(Continued)

*Primary Examiner*—David C Payne
*Assistant Examiner*—Zewdu Kassa
(74) *Attorney, Agent, or Firm*—Pearl Cohen Zedek Latzer, LLP

(57) ABSTRACT

A modulator including a direct modulation synthesizer circuit, a reference frequency oscillator for providing an input reference signal to the direct modulation synthesizer circuit for locking a carrier frequency to a stable frequency and a pre-emphasis unit for data bits and for producing a modulating signal for direct modulation of the direct modulation synthesizer circuit, the modulating signal having data bit dependent voltage levels.

14 Claims, 7 Drawing Sheets

U.S. PATENT DOCUMENTS

| | | | |
|---|---|---|---|
| 4,854,328 A | 8/1989 | Pollack | |
| 5,010,412 A | 4/1991 | Garriss | |
| 5,187,572 A | 2/1993 | Nakamura et al. | |
| 5,202,961 A | 4/1993 | Mills et al. | |
| 5,267,033 A | 11/1993 | Hoshino | |
| 5,279,607 A | 1/1994 | Schentag et al. | |
| 5,351,161 A | 9/1994 | MacKay et al. | |
| 5,355,450 A | 10/1994 | Garmon et al. | |
| 5,457,714 A * | 10/1995 | Engel et al. | 375/247 |
| 5,477,858 A | 12/1995 | Norris et al. | |
| 5,486,861 A | 1/1996 | Miyamoto et al. | |
| 5,495,114 A | 2/1996 | Adair | |
| 5,519,828 A | 5/1996 | Rayner | |
| 5,604,531 A | 2/1997 | Iddan et al. | |
| 5,643,175 A | 7/1997 | Adair | |
| 5,678,568 A | 10/1997 | Uchikubo et al. | |
| 5,681,260 A | 10/1997 | Ueda et al. | |
| 5,697,377 A | 12/1997 | Wittkampf | |
| 5,738,110 A | 4/1998 | Beal et al. | |
| 5,749,367 A | 5/1998 | Gamlyn et al. | |
| 5,819,736 A | 10/1998 | Avny et al. | |
| 5,833,603 A | 11/1998 | Kovacs et al. | |
| 5,875,280 A | 2/1999 | Takaiwa et al. | |
| 5,886,353 A | 3/1999 | Spivey et al. | |
| 5,909,026 A | 6/1999 | Zhou et al. | |
| 5,928,159 A | 7/1999 | Eggers et al. | |
| 5,929,901 A | 7/1999 | Adair et al. | |
| 5,983,077 A * | 11/1999 | Dent | 455/44 |
| 5,986,693 A | 11/1999 | Adair et al. | |
| 5,993,378 A | 11/1999 | Lemelson | |
| 6,018,650 A | 1/2000 | Petsko et al. | |
| 6,043,839 A | 3/2000 | Adair et al. | |
| 6,053,873 A | 4/2000 | Govari et al. | |
| 6,157,853 A | 12/2000 | Blume et al. | |
| 6,188,355 B1 | 2/2001 | Gilboa | |
| 6,233,476 B1 | 5/2001 | Strommer et al. | |
| 6,240,312 B1 | 5/2001 | Alfano et al. | |
| 6,304,769 B1 | 10/2001 | Arenson et al. | |
| 6,310,642 B1 | 10/2001 | Adair et al. | |
| 6,328,212 B1 | 12/2001 | Metlitasky et al. | |
| 6,351,606 B1 | 2/2002 | Yamazaki | |
| 6,438,405 B1 | 8/2002 | Mooney et al. | |
| 6,546,276 B1 | 4/2003 | Zanelli | |
| 6,587,711 B1 | 7/2003 | Alfano et al. | |
| 6,594,036 B1 | 7/2003 | Wong et al. | |
| 6,607,301 B1 | 8/2003 | Glukhovsky et al. | |
| 6,636,263 B2 | 10/2003 | Oda | |
| 6,667,765 B1 | 12/2003 | Tanaka | |
| 6,690,412 B1 | 2/2004 | Higo | |
| 6,709,387 B1 | 3/2004 | Glukhovsky et al. | |
| 6,865,718 B2 | 3/2005 | Montalcini | |
| 7,009,634 B2 | 3/2006 | Iddan et al. | |
| 7,039,453 B2 | 5/2006 | Mullick et al. | |
| 7,236,063 B2 * | 6/2007 | Ochi et al. | 331/183 |
| 2001/0019364 A1 | 9/2001 | Kawahara | |
| 2001/0035902 A1 | 11/2001 | Iddan et al. | |
| 2002/0042562 A1 | 4/2002 | Meron et al. | |
| 2002/0093484 A1 | 7/2002 | Skala et al. | |
| 2002/0103417 A1 | 8/2002 | Gazdzinski | |
| 2002/0103425 A1 | 8/2002 | Mault | |
| 2002/0171669 A1 | 11/2002 | Meron et al. | |
| 2003/0028978 A1 | 2/2003 | Glukhovsky | |
| 2003/0117491 A1 | 6/2003 | Avni et al. | |
| 2003/0174208 A1 | 9/2003 | Glukhovsky et al. | |
| 2005/0280568 A1* | 12/2005 | Rowland et al. | 341/155 |
| 2006/0052073 A1* | 3/2006 | Yoshikawa et al. | 455/180.3 |
| 2006/0082648 A1 | 4/2006 | Iddan et al. | |
| 2006/0158512 A1 | 7/2006 | Iddan et al. | |

FOREIGN PATENT DOCUMENTS

| | | |
|---|---|---|
| EP | 0 667 115 | 8/1995 |
| EP | 0 677 272 | 10/1995 |
| EP | 0 941 691 | 9/1999 |
| EP | 0 977 278 | 2/2000 |
| EP | 1 249 929 | 10/2002 |
| EP | 1 779 777 | 5/2007 |
| GB | 2 313 001 | 11/1997 |
| JP | 5745833 | 3/1982 |
| JP | 2000-39319 | 9/1990 |
| JP | 3289779 | 12/1991 |
| JP | 4022325 | 1/1992 |
| JP | 4109927 | 4/1992 |
| JP | 1992-144533 | 5/1992 |
| JP | 4180736 | 6/1992 |
| JP | 5015515 | 1/1993 |
| JP | 6114037 | 4/1994 |
| JP | 6114064 | 4/1994 |
| JP | 6154191 | 6/1994 |
| JP | 6285044 | 10/1994 |
| JP | 08-248326 | 9/1996 |
| JP | 09-327447 | 12/1997 |
| JP | 11225996 | 8/1999 |
| JP | 3017770 | 12/1999 |
| JP | 2001-025004 | 1/2001 |
| JP | 2001-224553 | 8/2001 |
| JP | 2002000556 | 1/2002 |
| KR | 99-68036 | 8/1999 |
| WO | WO 92/21307 | 12/1992 |
| WO | WO 97/33513 | 9/1997 |
| WO | WO 98/11816 | 3/1998 |
| WO | WO 99/21359 | 4/1999 |
| WO | WO 00/10456 | 3/2000 |
| WO | WO 00/22975 | 4/2000 |
| WO | WO 00/76391 | 12/2000 |
| WO | WO 01/06917 | 2/2001 |
| WO | WO 01/08548 | 2/2001 |
| WO | WO 01/35813 | 5/2001 |
| WO | WO 01/50941 | 7/2001 |
| WO | WO 01/65995 | 9/2001 |
| WO | WO 01/87377 | 11/2001 |
| WO | WO 02/080376 | 10/2002 |
| WO | WO 02/094337 | 11/2002 |
| WO | WO 02/095351 | 11/2002 |
| WO | WO 03/003706 | 1/2003 |
| WO | WO 03/009739 | 2/2003 |
| WO | WO 03/011103 | 2/2003 |
| WO | WO 03/028224 | 4/2003 |
| WO | WO 2004/082472 | 9/2004 |

OTHER PUBLICATIONS

U.S. Appl. No. 10/200,548, filed Jul. 23, 2002, Glukhovsky et al.
U.S. Appl. No. 10/724,109, filed Dec. 1, 2003, Glukhovsky et al.
U.S. Appl. No. 11/094,831, filed Mar. 31, 2005, Bettesh et al.
U.S. Appl. No. 11/337,570, filed Jan. 24, 2006, Iddan et al.
U.S. Appl. No. 11/295,491, filed Dec. 7, 2005, Iddan et al.
U.S. Appl. No. 60/251,493, filed Dec. 7, 2000, Skala et al.
U.S. Appl. No. 60/307,603, filed Jul. 26, 2001, Avni et al.
U.S. Appl. No. 60/187,883, filed Mar. 8, 2000, Meron et al.
"A Low-Power Miniature Transmitter Using a Low-Loss Silicon Platform for Biotelemetry" Ziaie B et al 19 Annual International Conference of The IEEE Engineering in Medicine and Biology Society. vol. 5, 1994 pp. 2221-2224.
BBC News Online—Pill Camera to "Broadcast from the Gut", Feb. 21, 2000, www.news.bbc.co.uk.
Chinese Office Action, Application No. 01807801 mailed Feb. 23, 2005.
European office action, Application No. 01912088.0 Dated Apr. 2, 2007.

European Office Action, Application No. 01912088.0 Dated Jun. 21, 2007.

European Search Report Application No. 07001478 Dated Apr. 2, 2007.

European Search Report Application No. 07001479 Dated Apr. 10, 2007.

"Integrated RF Transmitter Based on SAW Oscillator" Heuberger A et al. 23$^{rd}$ European Southampton, UK Sep. 16-18, 1997, Piscataway, NJ USA IEEE, pp. 344-347.

International Search Report—PCT application No. PCT/IL01/00218, Dated May 7, 2002.

Japanese Office Action, Application No. 2005-156061 dated Nov. 2, 2005.

Japanese Office Action. Application No. 2005-156060 dated Aug. 29, 2005.

Japanese Office Action, Application No. 2001-564653 Dated Jun. 12, 2007.

Korean Office Action, Application No. 2002-7011833 Dated Nov. 2, 2005.

Korean Office Action, Application No. 2006-7004181 Dated Apr. 24, 2006.

Korean Office Action, Application No. 2006-7004181 Dated Jan. 26, 2007.

Korean Office Action, Application No. 2006-7019809 Dated May 28, 2007.

Manual of Photogrammetry, Thompson (Ed.), Third Edition, vol. Two, American Society of Photogrammetry, 1996.

Office Action dated Sep. 27, 2004 U.S. Appl. No. 09/800,470.

Office Action dated Aug. 4, 2005 U.S. Appl. No. 09/800,470.

Supplementary European Search Report Application No. 01912088 Dated Mar. 21, 2006.

Supplementary European Search Report Application No. 06010954.3 Dated Aug. 3, 2006.

Biomedical Telemetry, R Stewart McKay, John Wiley and Sons, 1970, p. 244-245.

Supplementary European Search Report Application No. 06010954.3 Dated Nov. 7, 2006.

The Radio Pill, Rowlands, et al. British Communications and Electronics, Aug. 1960, pp. 598-601.

Wellesley Company Sends Body Monitors into Space—Crum, Apr. 1998.

Wireless Transmission of a Color Television Moving Image from the Stomach Using a Miniature CCD Camera, Light Source and Microwave Transmitter. Swain CP, Gong F, Mills TN. Gastrointest Endosc 1997: 45:AB40.

www.jason.net—Tiny cam © 2000.

www.pedinc.com—Personal Electronic Devices, Inc. © 1997.

Australian Office Action, Application No. 2005-244523 Dated Feb. 6, 2007.

International Search Report for PCT Application No. PCT/IL2004/000265 International filing date: Mar. 23, 2004.

Office Action mailed Jun. 3, 2004. U.S. Appl. No. 10/004,270.

Office Action mailed May 20, 2005. U.S. Appl. No. 10/004,270.

Office Action mailed Feb. 23. 2006. U.S. Appl. No. 10/004,270.

Office Action mailed Aug. 1, 2006. U.S. Appl. No. 10/004,270.

International Search Report for PCT Application No. PCT/IL01/00215 International filing date: May 7, 2002.

International Search Report for PCT Application No. PCT/IL03/01080 International filing date: Dec. 16, 2003.

* cited by examiner

MODULATOR AND METHOD FOR PRODUCING A MODULATED SIGNAL

PRIOR APPLICATION DATA

This application claims benefit and priority of U.S. Provisional Patent Application No. 60/690,138, filed on Jun. 14, 2005, entitled "Device, System, and Method for Transmitting Data from an In Vivo Device", which is hereby incorporated by reference in its entirety.

FIELD OF THE INVENTION

The present invention relates in general to the field of transmitting data from an in-vivo device. More specifically, the present invention relates to high bit rate transmission of a modulated signal from an in-vivo device.

BACKGROUND OF THE INVENTION

Devices and methods for in-vivo sensing of passages or cavities within a body, and for sensing and gathering information (e.g., image information, pH information, temperature information, electrical impedance information, pressure information, etc.), are known in the art.

In-vivo sensing devices such as capsules may include a sensing system and a transmission system, wherein the sensing system collects data and the transmission system transmits the collected data by Radio Frequency (RF) to an external receiver system, e.g., for further processing and display. One known method for transmitting information with an RF signal is by MSK (Minimum Shift Keying) direct modulation. However, the limited bandwidth of the modulator may limit the transmission rate.

SUMMARY OF THE INVENTION

In accordance with some embodiments of the present invention there is provided a modulator for producing a modulated signal, the modulator comprising:

a direct modulation synthesizer circuit;

a reference frequency oscillator for providing an input reference signal to the direct modulation synthesizer circuit for locking a carrier frequency to a stable frequency;

a pre-emphasis unit for receiving data bits and for producing a modulating signal for the direct modulation synthesizer circuit, the modulating signal having data bit dependent voltage levels.

In accordance with some embodiments, the modulator is located in an in-vivo sensing device.

There is also provided in accordance with the present invention an in-vivo sensing device comprising a modulator for producing a modulated signal, the modulator comprising:

a direct modulation synthesizer circuit;

a reference frequency oscillator for providing an input reference signal to the direct modulation synthesizer circuit for locking a carrier frequency to a stable frequency;

a pre-emphasis unit for receiving data bits and for producing a modulating signal for direct modulation of the direct modulation synthesizer circuit, the modulating signal having data bit dependent voltage levels.

In some embodiments, the in-vivo sensing device comprises an imager, one or more illumination sources and an optical system.

If desired, the in-vivo sensing device comprises a processor, a transmitter and an antenna.

There is also provided in accordance with some embodiments of the present invention, a method for producing a modulated signal, comprising:

providing a direct modulation synthesizer circuit;

inputting a reference signal to the direct modulation synthesizer circuit for locking a carrier frequency to a stable frequency;

inputting a modulating signal to the direct modulation synthesizer circuit, the modulating signal having data bit dependent voltage levels; and outputting the modulated signal from the direct modulation synthesizer circuit.

If desired, the modulated signal is a CPFSK signal.

In accordance with some embodiments, the pre-emphasis unit is a digital-to-analog converter (D/A) and each voltage level of the modulating signal is a function of the bit values of a given data bit and of the data bit preceding the given data bit.

In accordance with some embodiments, the pre-emphasis unit is a digital-to-analog converter (D/A) and each voltage level of the modulating signal is a function of the bit values of a given data bit and of more than one data bit preceding the given data bit.

If desired, the modulating signal has at least four voltage levels.

In accordance with some embodiments, the at least four voltage levels are:

V0, if the given data bit is "0" and the preceding data bit is "0";

V0−δV, if the given data bit is "0" and the preceding data bit is "1",

V1, if the given data bit is "1" and the preceding data bit is "1"; and

V1+δV, if the given data bit is "1" and the preceding data bit is "0";

where V1 and V0 are standard bit-voltage levels and V1 is greater that V0, and δV is a positive voltage enhancement value by which the standard bit-voltage levels are altered by the pre-emphasis unit.

In accordance with some embodiments, the direct modulation synthesizer circuit comprises a voltage controlled oscillator, into which the modulating signal is inputted, a phase detector that produces a phase detector output signal by comparing the input reference signal with a local frequency signal outputted from a feedback frequency divider connected to the voltage controlled oscillator, a charge pump that receives the phase detector output signal and that has an output signal that is inputted into a loop filter that produces a filtered signal that is inputted into the voltage controlled oscillator together with the modulating signal.

In accordance with some embodiments, the pre-emphasis unit comprises a digital-to-analog converter (D/A) and a low pass filter of at least order two with damping factor having a value of less than one, the low pass filter being located between the digital-to-analog converter and the direct modulation synthesizer circuit.

Further in accordance with some embodiments, the modulating signal outputted from the low pass filter to the direct modulation synthesizer circuit has two voltage levels.

Yet further in accordance with some embodiments, the modulating signal has an overshoot if a given data bit is 1 and the data bit preceding the given data bit is 0; and has undershoot if the given data bit is 0 and the data bit preceding the given data bit is 1.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

DETAILED DESCRIPTION OF THE INVENTION

Figure 1:
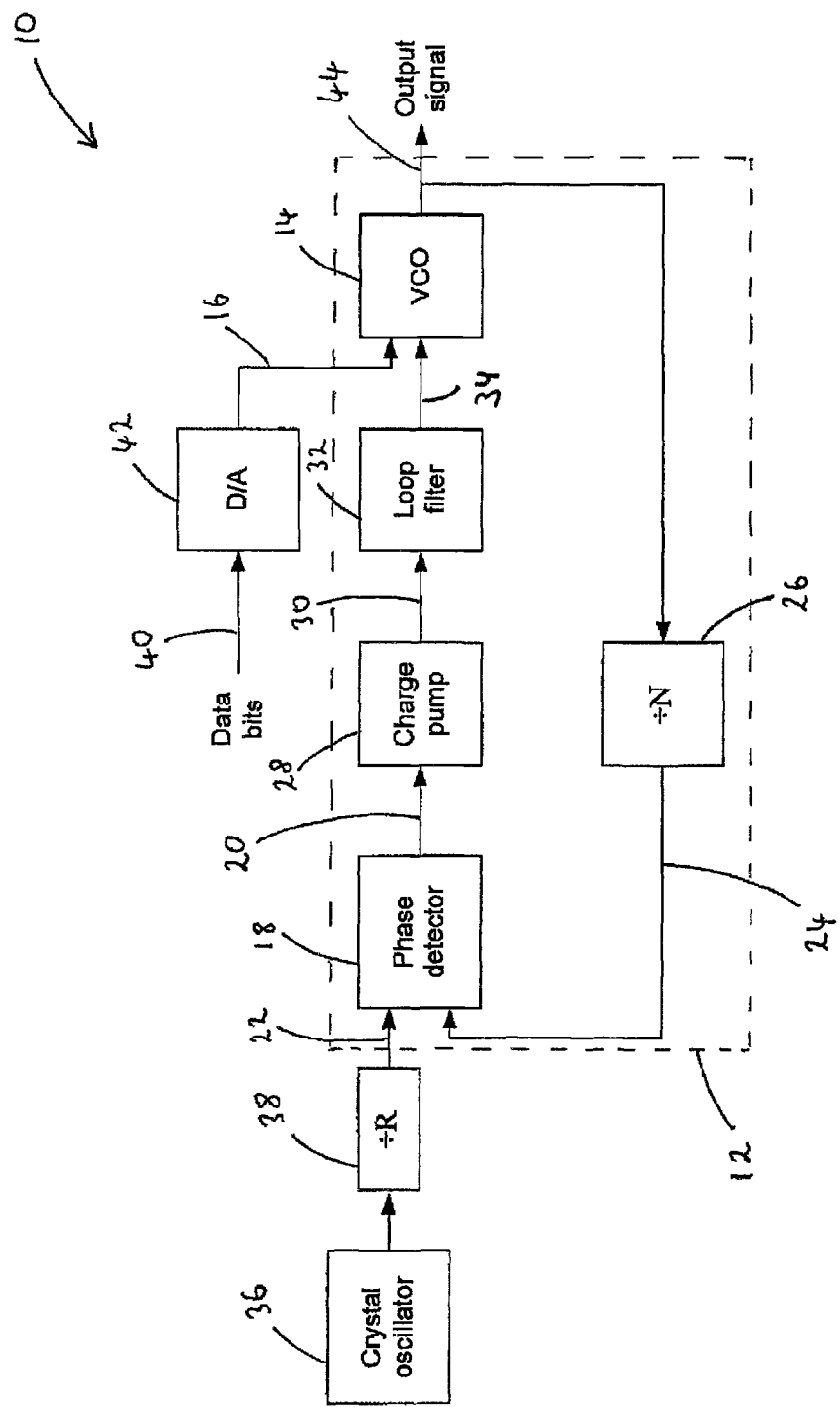
FIG. 1 is a block diagram of a CPFSK modulator according to an embodiment of the present invention.

In the following description, various aspects of the invention will be described. For purposes of explanation, specific configurations and details are set forth in order to provide a thorough understanding of the invention. However, it will also be apparent to a person skilled in the art that the invention may be practiced without the specific details presented herein. Furthermore, well-known features may be omitted or simplified in order not to obscure the invention.

It should be noted that although a portion of the discussion may relate to in-vivo imaging devices, systems, and methods, the present invention is not limited in this regard, and embodiments of the present invention may be used in conjunction with various other in-vivo sensing devices, systems, and methods. For example, some embodiments of the invention may be used, for example, in conjunction with in-vivo sensing of pH, in-vivo sensing of temperature, in-vivo sensing of pressure, in-vivo sensing of electrical impedance, in-vivo detection of a substance or a material, in-vivo detection of a medical condition or a pathology, in-vivo acquisition or analysis of data, and/or various other in-vivo sensing devices, systems, and methods.

It is noted that discussions herein utilizing terms such as "processing", "computing", "calculating", "determining", or the like, refer to the action and/or processes of a computer or computing system, or similar electronic computing device or platform, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. Such apparatus may be specially constructed for the desired purposes, or it may comprise a general purpose computer selectively activated, adapted, operated, configured or re-configured by a computer program stored in the computer. Such a computer program may be stored in a computer readable storage medium, such as, but not limited to, a disk, a hard disk drive, a floppy disk, an optical disk, a CD-ROM, a DVD, a magnetic-optical disk, Read-Only Memory (ROM), Random Access Memory (RAM), Electrically Programmable ROM (EPROM), Electrically Erasable and Programmable ROM (EEPROM), Flash memory, volatile memory, non-volatile memory, magnetic or optical cards, or any other type of storage media or storage unit suitable for storing electronic instructions and capable of being operatively connected to a computer system bus or a computing platform.

The processes and displays presented herein are not inherently related to any particular computer or other apparatus. Various general purpose systems may be used with programs in accordance with the teachings herein, or it may prove convenient to construct a more specialized apparatus to perform a desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Some embodiments of the present invention are directed to a typically swallowable in-vivo sensing device, e.g., a typically swallowable in-vivo imaging device. Devices according to embodiments of the present invention may be similar to embodiments described in U.S. Pat. No. 7,009,634 and/or in U.S. Pat. No. 5,604,531, each of which is assigned to the common assignee of the present invention and each of which is hereby fully incorporated by reference. Furthermore, a receiving and/or display system which may be suitable for use with embodiments of the present invention may also be similar to embodiments described in U.S. Pat. No. 7,009,634 and/or in U.S. Pat. No. 5,604,531. Of course, devices and systems as described herein may have other configurations and/or other sets of components. For example, the present invention may be practiced using an endoscope, needle, stent, catheter, etc.

Reference is now made to FIG. 1 showing a block diagram of a CPFSK (Continuous Phase Frequency Shift Keying) direct modulator 10 according to an embodiment of the present invention. The modulator 10 includes a direct modulation synthesizer circuit 12, similar to a constant wave (CW) synthesizer, that sets the carrier frequency. The direct modulation synthesizer circuit 12 has a voltage controlled oscillator (VCO) 14, into which a modulating signal 16, having a modulation voltage, is inputted; a phase detector 18 that produces a phase detector output signal 20 by comparing an input reference signal 22 with a local frequency signal 24 outputted from a feedback frequency divider 26 connected to the VCO 14; a charge pump 28 that receives the phase detector output signal 20 and that has a charge pump output signal 30 that is inputted into a loop filter 32 that produces a filtered signal 34 that is inputted into the VCO 14 together with the modulating signal 16. The VCO input may be the combined sum of the modulating signal 16 and the filtered signal 34. The input reference signal 22 may be produced by a reference frequency oscillator 36, such as crystal oscillator, followed by a reference frequency divider 38. The modulating signal 16 may be obtained from data bits 40 that have undergone pre-emphasis by a pre-emphasis unit, such as a digital-to-analog converter (D/A) 42. The data bits 40 (also referred to in the drawings as, "transmitted bits") may be transmitted internally in an in-vivo sensing device from a sensor, such as an imager (see description below with respect to FIG. 7), to the digital-to-analog converter 42. The output signal 44 may be inputted to a transmitter inside the in-vivo sensing device for transmitting to an external receiver system, e.g., for further processing and display. The voltage controlled oscillator 14 may include a transmitting antenna, in which case a separate transmitter is not required.

Figure 2:
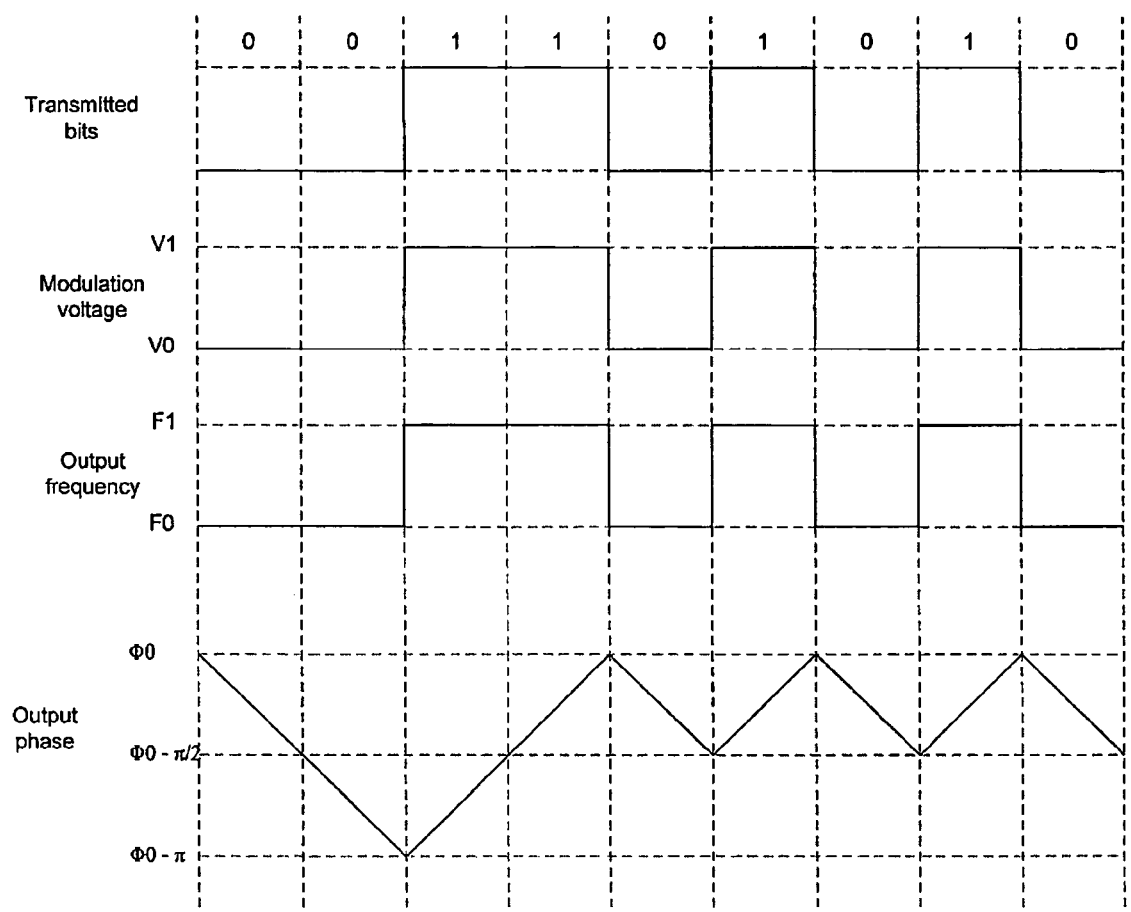
FIG. 2 shows the data bits, modulation voltage, output frequency and output phase for ideal direct MSK modulation using the CPFSK modulator of FIG. 1.

Reference is now made to FIG. 2 which shows four graphs. The graph labeled "transmitted bits" shows an example for data bits 40 given by an MSK 1 bit/symbol signal. The graph labeled "Modulation voltage" shows the modulation voltage of the modulating signal 16 outputted by the digital-to-analog converter 42 to the VCO 14. The two lower graphs show the output frequency and output phase of the output signal 44, outputted by the modulator 10 for the case of ideal modulation in which there is no distortion of the signal modulated by the modulator 10. In this ideal case, the VCO 14 changes the output frequency instantly during transitions between binary bit 0 and binary bit 1.

The output phase is calculated as an integral over the output frequency. Since this example is for MSK modulation, each symbol causes a phase difference of $\pm\pi/2$ [rad] according to the modulated bits. Binary bit 1 corresponds to $+\pi/2$ [rad] while binary bit 0 corresponds to $-\pi/2$ [rad]. Throughout the specification and claims, the terms 'binary bit 0' and 'binary bit 1' will also be denoted simply by "0" and "1", respectively. In this example, there are only 4 possible values to phase at the end of each symbol: $\Phi 0$, $\Phi 0\pm\pi/2$, $\Phi 0-\pi$. In the phase calculation it is assumed, for simplicity, that the carrier frequency is zero. Other phase differences and modulated bits may be used.

Figure 3:
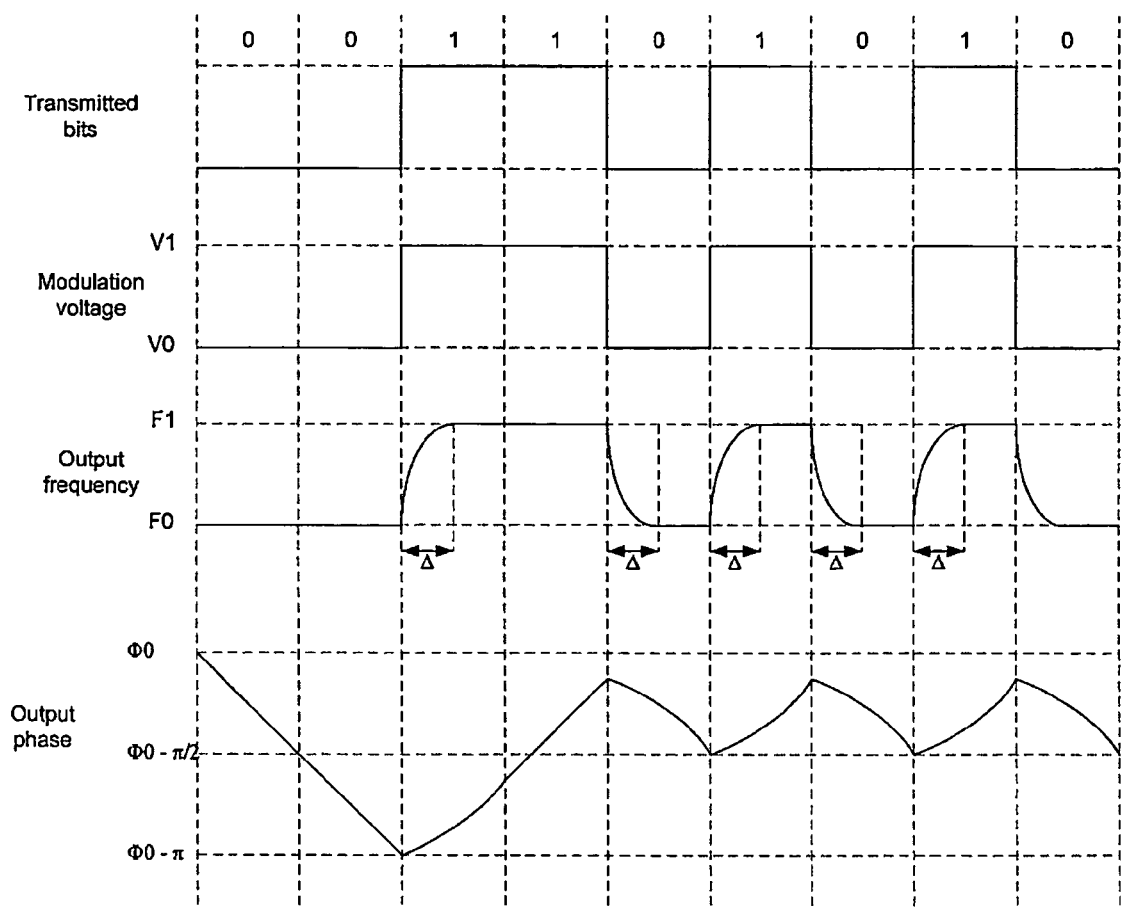
FIG. 3 shows the data bits, modulation voltage, output frequency and output phase for direct MSK modulation for a narrow bandwidth Voltage Controlled Oscillator modulator according to an embodiment of the present invention.

In practice, the VCO 14 has a finite bandwidth, and a finite time is required for the frequency to reach its steady state value. The wider the VCO bandwidth, the less time is required for frequency change. FIG. 3 shows an example for direct MSK modulation for a case in which the VCO 14 has a narrow-bandwidth, according to one embodiment of the present invention. While the modulation voltage in FIG. 3 is identical to that of FIG. 1, the output frequency of the VCO 14 in FIG. 3 is different from that of FIG. 1. Whenever there is a frequency change between two adjacent symbols, the output frequency reaches the desired steady state frequency only after some finite time interval (marked as $\Delta$ in FIG. 3). On the other hand, if the frequency does not change between two adjacent symbols, this problem does not exist. Another way of describing this situation is by saying that the finite convergence time of the output frequency to reach its steady state value, appears only when there are "1"→"0" or "0"→"1" transitions in the data bits. The existence of the finite time interval, $\Delta$, required for frequency convergence may cause, for example, the following problems:

1. The phase difference corresponding to a symbol following a transition does not reach the $\pm\pi/2$ phase deviation. As a result:
    a. The Bit Error Rate (BER) performance of the receiver is deteriorated since the minimal distance between signal points decreases according to $\sin^2$(phase difference).
    b. The phases of the subsequent symbols do not have the four possible values as in the case of ideal modulation namely, $\Phi 0$, $\Phi 0\pm\pi/2$, $\Phi 0-\pi$. This makes it difficult for the receiver to track the phase.
2. The phase change for symbols which are substantially identical to the preceding symbols is still $\pm\pi/2$.

In other words, the phase of a given symbol depends not only on the given symbol but also on the preceding symbol. Of course, when $\Delta$ is small relative to the symbol length (for example, if $\Delta$ is smaller than 10% of the symbol time), the above observations may be practically ignored.

In cases in which $\Delta$ cannot be ignored, the modulating signal may be pre-emphasized (or, pre-distorted) so that the modulated signal may have the desired properties. According to one embodiment of the present invention, this is done by controlling the D/A output voltage (i.e., the modulation voltage) so that it is a function of both a given data bit and the bit preceding given data bit. This is in contrast to the ideal case (FIG. 2) in which the D/A output is only a function of each given data bit.

According to an embodiment of the present invention, the modulating signal has four voltage levels. Each voltage level is a function of the binary bit value of a given data bit and of the binary bit value of the data bit preceding the given data bit. The four voltage level may be given by:

V0, if the given data bit is "0" and the preceding data bit is "0";

V0-δV, if the given data bit is "0" and the preceding data bit is "1";

V1, if the given data bit is "1" and the preceding data bit is "1"; and

V1+δV, if the given data bit is "1" and the preceding data bit is "0";

where V1 and V0 are standard bit voltage levels, V1 is greater that V0, and δV is a positive voltage enhancement value by which the standard bit voltage levels are altered by the digital-to-analog converter 42.

According to some embodiments, each voltage level may be a function of the binary bit value of a given data bit and of the binary bit value of more than one data bit preceding the given data bit.

According to some embodiments of, the modulating signal may have more than four voltage levels.

Figure 4:
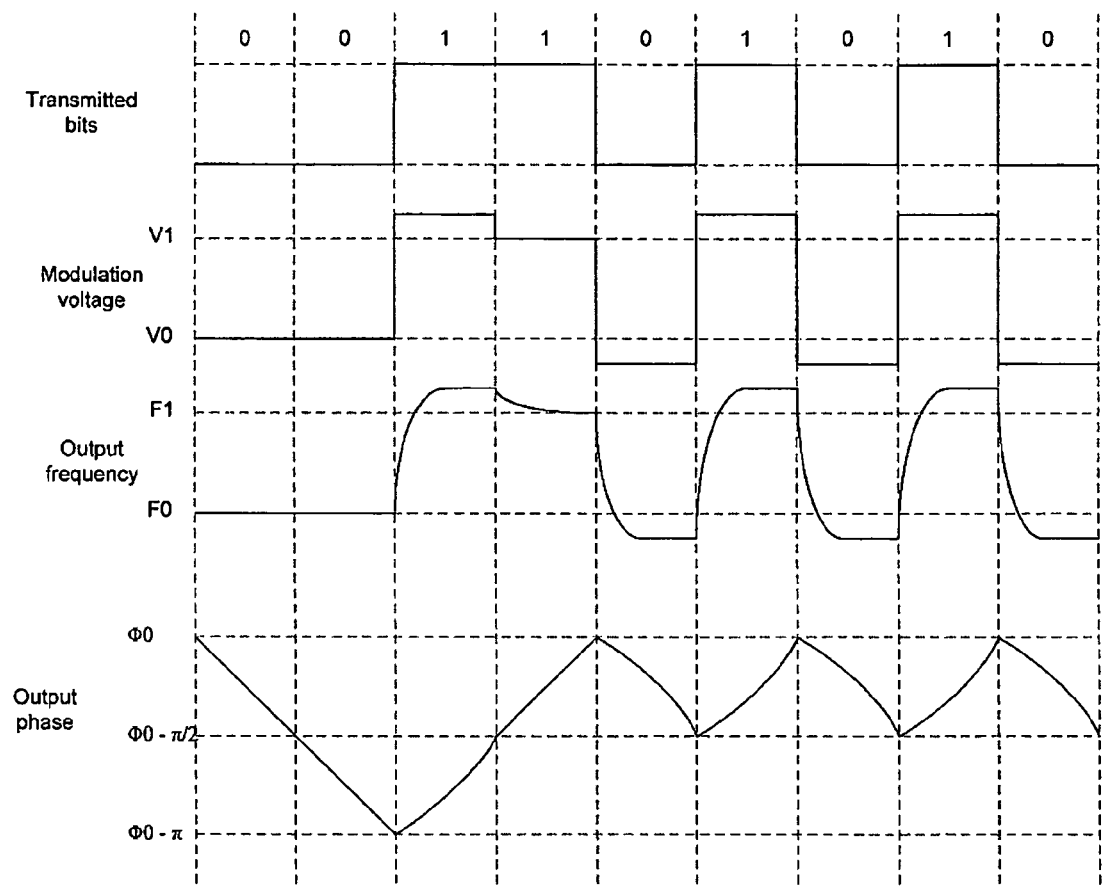
FIG. 4 shows the data bits, modulation voltage, output frequency and output phase for direct MSK modulation for a narrow bandwidth Voltage Controlled Oscillator modulator, using pre-emphasis according to one embodiment of the present invention with the CPFSK modulator of FIG. 1.

According to an embodiment of the present invention, each of the above voltages is chosen such that the phase difference for all symbols is $\pm\pi/2$. This can be achieved using a calibration procedure for V0, V1, δV. FIG. 4 shows the four voltage levels of the modulation voltage as well as the resulting output frequency and phase of the output signal 44. Note that the final steady state frequency corresponding to enhanced level for bit '1' is greater than the steady state frequency for bit '1'. However, the accumulated phase for both cases is $+\pi/2$. Similarly the final steady state frequency corresponding to the enhanced level binary bit 0 is less than the steady state frequency for the non-enhanced level binary bit 0 while the accumulated phase for both cases is $-\pi/2$.

According to an embodiment of the present invention, the output phase of the output signal produced by the pre-emphasized modulating signal is not the same as the output phase of the output signal 44 for the output phase for the ideal modulation case shown in FIG. 2. However, the phases at the end of each symbol are located at four points, namely $\Phi 0$, $\Phi 0\pm\pi/2$, $\Phi 0-\pi$. This improves the BER performance as well as the receiver tracking of the output phase of the output signal 44.

Although the present invention has been illustrated in FIGS. 2 to 4 for MSK modulation, it will be apparent to the skilled person that it may easily extended to CPFSK modulation for any number of bits/symbol.

Figure 5:
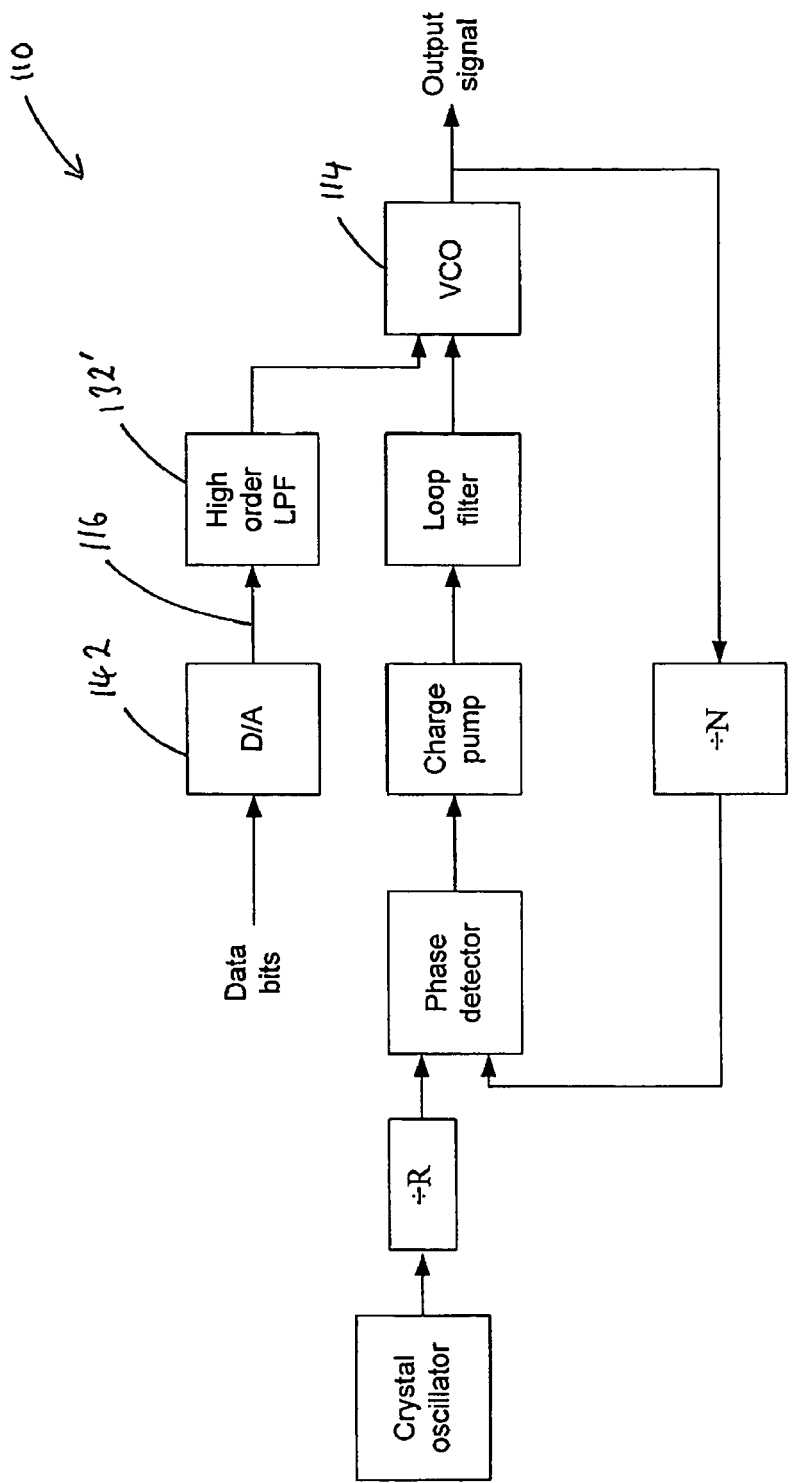
FIG. 5 is a block diagram of a CPFSK modulator according to another embodiment of the present invention.
Figure 6:
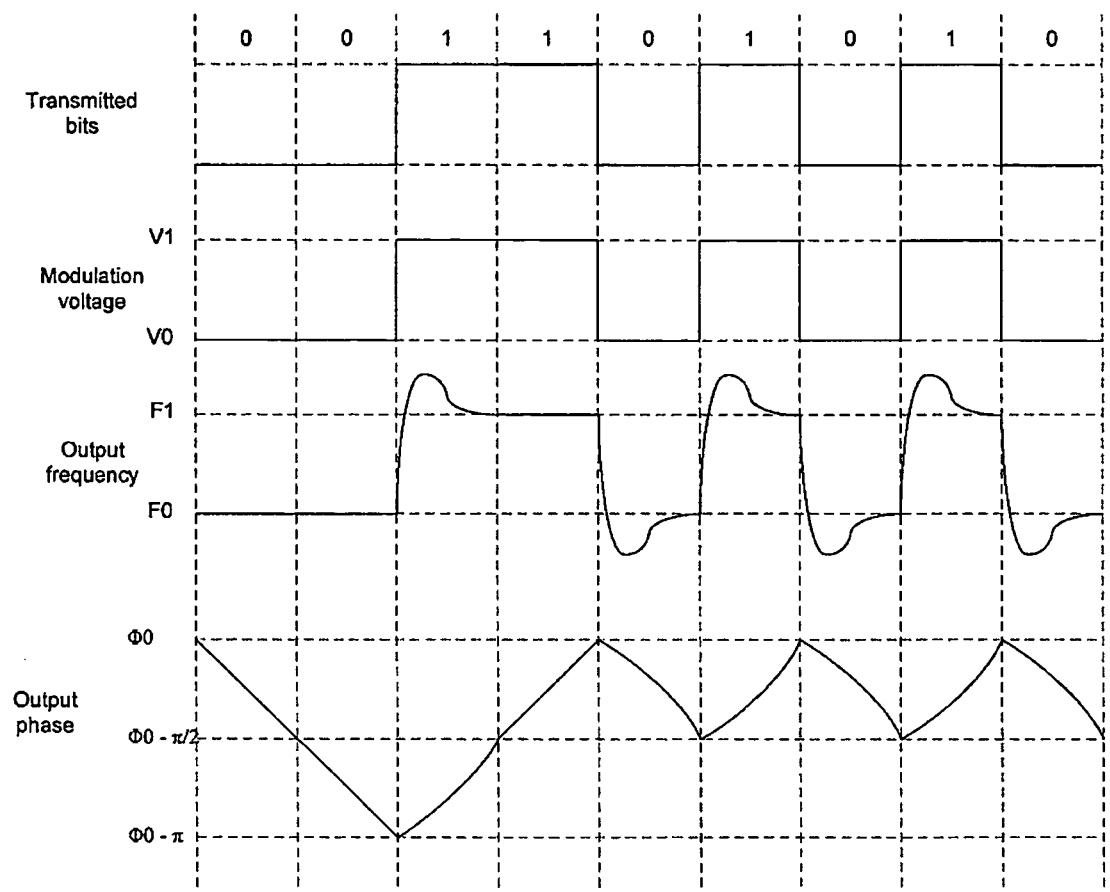
FIG. 6 shows the data bits, modulation voltage, output frequency and output phase for direct MSK modulation for a narrow bandwidth Voltage Controlled Oscillator modulator, using pre-emphasis according to another embodiment of the present invention with the CPFSK modulator of FIG. 5.

Attention is now drawn to FIGS. 5 and 6. FIG. 5 shows a block diagram of a second CPFSK modulator 110 according to another embodiment of the present invention. The second modulator 110 is similar in structure to the modulator 10 shown in FIG. 1, except that the digital-to-analog converter 142 is a two-level D/A and there is a high order Low Pass Filter (LPF) 132' between the digital-to-analog converter 142 and the voltage controlled oscillator 114. The low pass filter 132' is of at least second order, with damping factor $\zeta<1$. The modulating signal 116 does not undergo pre-emphasis, so that the voltage level of a given data bit depends only on the value of the given data bit (V0 for binary bit 0 and V1 for binary bit 1, see FIG. 6).

The modulating signal 116 is passed through the low pass filter 132' and the low damping factor causes overshoot and undershoot of the frequency of the modulating signal 116 as shown in FIG. 6 (see "Output frequency"). In accordance with some embodiments, the output frequency of the modulating signal has overshoot if a given data bit is "1" and the data bit preceding the given data bit is "0" (i.e., a "0"→"1" transition); and has undershoot if the given data bit is "0" and the data bit preceding the given data bit is "1" (i.e., a "1"→"0" transition). If the given data bit and the data bit preceding the given data bit are equal, then the low pass filter 132' does not alter the modulating signal 116. The amount of overshoot or undershoot can be controlled through the value of the damping factor $\zeta$. As the damping factor $\zeta$ decreases the overshoot and undershoot deviations from steady state value increase. The value of $\zeta$ may be calibrated in order to reach a phase difference of $\pm\pi/2$ for every symbol. Although the embodiment of present invention shown in FIGS. 5 and 6 has been illustrated for MSK modulation, it will be apparent to the skilled person that it may easily extended to CPFSK modulation for any number of bits/symbol.

Figure 7:
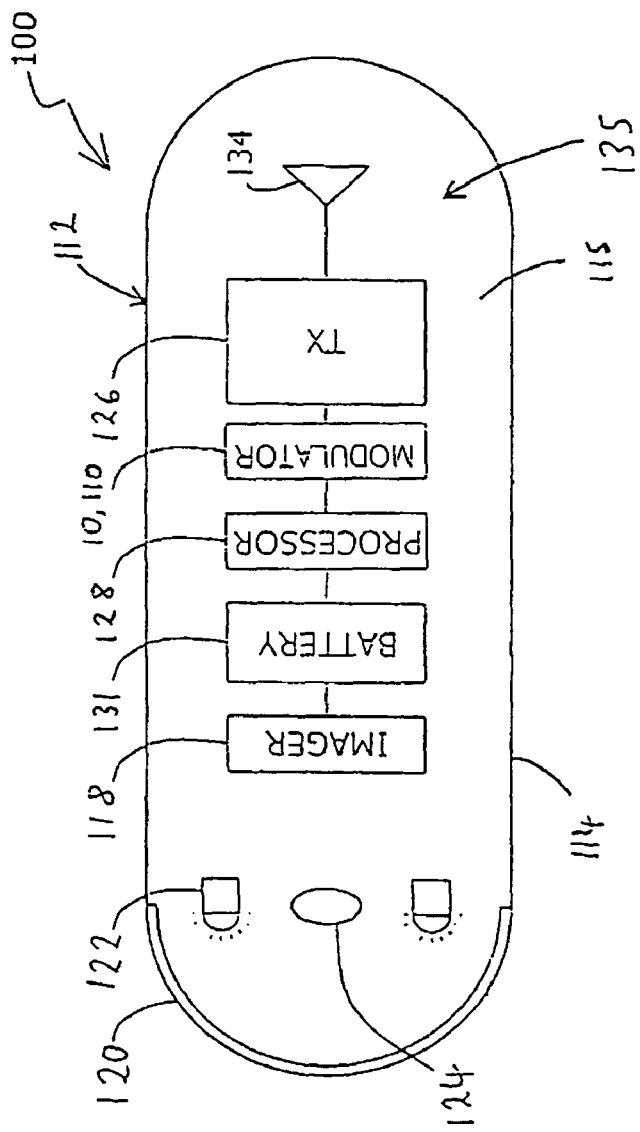
FIG. 7 is a simplified conceptual illustration of an in vivo sensing device according to an embodiment of the present invention.

Reference is made to FIG. 7, showing a schematic diagram of an in-vivo sensing device 100 according to embodiments of the present invention. In some embodiments, the in-vivo sensing device 100 may be a wireless device. In some embodiment, the in-vivo sensing device 100 may be autonomous. In some embodiments, the in-vivo sensing device 100 may be a swallowable capsule for sensing the gastrointestinal tract of a patient. However, other body lumens or cavities may be sensed or examined with the in-vivo sensing device 100. The in-vivo sensing device 100 has a housing 112 having an external surface 114 and an inner chamber 115 that may include at least one sensor such as an imager 118 for capturing image frames of images of the gastrointestinal tract or other body lumens or cavities, a viewing window 120, one or more illumination sources 122, an optical system 124, a transmitter 126, a processor 128, the modulator 10, 110 according to embodiments of the invention, and a power supply such as a battery 131. The modulator 10, 110 may be part of the transmitter 126. An antenna 134 may be connected to the transmitter 126. According to some embodiments, the processor 128 may include a memory.

The illumination sources 122 may project light through the viewing window 120 to illuminate portions of the body lumens or cavities, in which the in-vivo sensing device 100 is located, and images of the illuminated portions are captured by the imager 118 via the optical system 124. Captured image data in the form of data bits 40 may be inputted to the modulator 10, as described hereinabove. As described with respect to FIG. 1, the output signal 44 may be inputted to the transmitter 126 for transmission to an external receiver system, e.g., for further processing and display. As mentioned above, the voltage controlled oscillator 14 may include a transmitting antenna, in which case the separate transmitter 126 and antenna 34 may not be required. While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. A modulator comprising:
   a direct modulation synthesizer circuit for producing a modulated signal to be inputted to a transmitter;
   a reference frequency oscillator for providing an input reference signal to the direct modulation synthesizer circuit for locking a carrier frequency to a stable frequency; and
   a pre-emphasis unit for receiving data bits and for producing a modulating signal for direct modulation by the direct modulation synthesizer circuit, the modulating signal having data bit dependent voltage levels;
   wherein the pre-emphasis unit is a digital-to-analog converter and wherein each voltage level of the modulating signal is a function of the bit values of a given data bit and of at least one data bit preceding the given data bit;
   wherein the modulating signal has at least four voltage levels; wherein the at least four voltage levels are:
   V0, if the given data bit is "0" and the preceding data bit is "0";
   V0−δV, if the given data bit is "0" and the preceding data bit is "1";
   V1, if the given data bit is "1" and the preceding data bit is "1"; and
   V1+δV, if the given data bit is "1" and the preceding data bit is "0".

2. The modulator according to claim 1, wherein the modulator is a CPFSK (Continuous Phase Frequency Shift Keying) modulator.

3. The modulator according to claim 1, wherein the direct modulation synthesizer circuit comprises a voltage controlled oscillator, into which the modulating signal is inputted, a phase detector that produces a phase detector output signal by comparing the input reference signal with a local frequency signal outputted from a feedback frequency divider connected to the voltage controlled oscillator, a charge pump that receives the phase detector output signal and that has an output signal that is inputted into a loop filter that produces a filtered signal that is inputted into the voltage controlled oscillator together with the modulating signal.

4. The modulator according to claim 1, wherein the modulator is located in an in-vivo sensing device.

5. An in-vivo sensing device comprising a modulator, the modulator comprising:
   a direct modulation synthesizer circuit for producing a modulated signal to be; inputted to a transmitter;
   a reference frequency oscillator for providing an input reference signal to the direct modulation synthesizer circuit for locking a carrier frequency to a stable frequency;
   a pre-emphasis unit for receiving data bits and for producing a modulating signal for direct modulation of the direct modulation synthesizer circuit, the modulating signal having data bit dependent voltage levels;
   wherein the pre-emphasis unit is a digital-to-analog converter and wherein each voltage level of the modulating signal is a function of the bit values of a given data bit and at least of the data bit preceding the given data bit; wherein the modulating signal has at least four voltage levels; wherein the at least four voltage levels are: V0, if the given data bit is "0" and the preceding data bit is "0"; V0 −δV, if the given data bit is "0" and the preceding data bit is "1"; V1, if the given data bit is "1" and the preceding data bit is "1"; and V1 +δV, if the given data bit is "1" and the preceding data bit is "0".

6. The in-vivo sensing device according to claim 5, comprising an imager, one or more illumination sources and an optical system.

7. A method for producing a modulated signal, comprising: providing a direct modulation synthesizer circuit; inputting said modulating signal to the direct modulation synthesizer circuit; outputting the modulated signal from the direct modulation synthesizer circuit; and inputting the modulated signal to a transmitter; wherein the modulating signal has at least four voltage levels; wherein the at least four voltage levels are: V0, if the given data bit is "0" and the preceding data bit is "0"; V0 −δV, if the given data bit is "0" and the preceding data bit is "1"; V1, if the given data bit is "1" and the preceding data bit is "1"; and V1 +δV, if the given data bit is "1" and the preceding data bit is "0"; where V1 and V0 are standard bit-voltage levels and V1 is greater that V0, and δV is a positive voltage enhancement value by which the standard bit-voltage levels are altered by the pre-emphasis unit.

8. The method according to claim 7, wherein the modulator is a CPFSK (Continuous Phase Frequency Shift Keying) modulator.

9. The method according to claim 7, wherein the direct modulation synthesizer circuit comprises a voltage controlled oscillator, into which the modulating signal is inputted, a phase detector that produces a phase detector output signal by comparing the input reference signal with a local frequency signal outputted from a feedback frequency divider connected to the voltage controlled oscillator, a charge pump that receives the phase detector output signal and that has an output signal that is inputted into a loop filter that produces a filtered signal that is inputted into the voltage controlled oscillator together with the modulating signal.

10. A method for producing a modulated signal, comprising:
providing a direct modulation synthesizer circuit;
inputting a reference signal having a given frequency to the direct modulation synthesizer circuit for locking a carrier frequency to a stable frequency;
reaching a phase difference of ±π/2 for every symbol of a signal using a low pass filter of at least order two with damping factor having a value of less than one to produce a modulating signal;
inputting said modulating signal to the direct modulation synthesizer circuit; wherein the modulating signal has at least four voltage levels; wherein the at least four voltage levels are: V0, if the given data bit is "0" and the preceding data bit is "0"; V0 −δV, if the given data bit is "0" and the preceding data bit is "1"; V1, if the given data bit is "1" and the preceding data bit is "1"; and V1 +δV, if the given data bit is "1" and the preceding data bit is "0".

11. The method according to claim 10, wherein the modulating signal outputted from the low pass filter to the direct modulation synthesizer circuit has two voltage levels.

12. The method according to claim 11, wherein the modulating signal has an overshoot if a given data bit is 1 and the data bit preceding the given data bit is 0; and has undershoot if the given data bit is 0 and the data bit preceding the given data bit is 1.

13. The method according to claim 10, wherein the modulator is a CPFSK (Continuous Phase Frequency Shift Keying) modulator.

14. The method according to claim 10, wherein the direct modulation synthesizer circuit comprises:
a voltage controlled oscillator, into which the modulating signal is inputted, said voltage controlled oscillator to produce an output signal;
a feedback frequency divider to receive said output signal and to output a local frequency signal;
a phase detector to produce a phase detector output signal by comparing said input reference signal with said local frequency signal;
a charge pump to receive said phase detector output signal; and
a loop filter to receive said charge pump output signal and to produce a filtered signal;
wherein said filtered signal is to be inputted into said voltage controlled oscillator together with said modulating signal.

* * * * *